United States Patent [19]

Singh et al.

[11] Patent Number: 5,015,851

[45] Date of Patent: May 14, 1991

[54] SLOW POSITRON BEAM GENERATOR FOR LIFETIME STUDIES

[75] Inventors: Jag J. Singh, Yorktown; Abe Eftekhari, Newport News; Terry L. St. Clair, Poquoson, all of Va.

[73] Assignee: The United States of America as represented by the Administrator of the National Aeronautics and Space Administration, Washington, D.C.

[21] Appl. No.: 531,372

[22] Filed: May 31, 1990

[51] Int. Cl.$^5$ .............................................. H01J 37/00

[52] U.S. Cl. .................................... 250/306; 250/307; 250/358.1

[58] Field of Search ...................... 250/306, 307, 358.1

[56] References Cited

U.S. PATENT DOCUMENTS

| | | | |
|---|---|---|---|
| 3,593,025 | 7/1971 | Grosskreutz | 250/358.1 |
| 4,064,438 | 12/1977 | Alex et al. | 250/358.1 |
| 4,897,549 | 1/1990 | Zerda et al. | 250/358.1 |

*Primary Examiner*—Bruce C. Anderson

*Attorney, Agent, or Firm*—George F. Helfrich

[57] ABSTRACT

A slow positron beam generator uses a conductive source residing between two test films. Moderator pieces are placed next to the test films on the opposite side of the conductive source. A voltage potential is applied between the moderator pieces and the conductive source. Incident energetic positrons are, first, emitted from the conductive source, second, passed through test film, and then, third, isotropically strike moderator pieces before diffusing out of the moderator pieces as slow positrons. The slow positrons diffusing out of moderator pieces are attracted to the conductive source which is held at an appropriate potential below the moderator pieces. The slow positrons have to pass through the test films before reaching the conductive source. A voltage is adjusted so that the potential difference between the moderator pieces and the conductive source forces the positrons to stop in the test films. Measurable annihilation radiation is emitted from the test film when positrons annihilate (combine) with electrons in the test film.

21 Claims, 4 Drawing Sheets

SLOW POSITRON BEAM GENERATOR FOR LIFETIME STUDIES

ORIGIN OF THE INVENTION

The invention described herein was made jointly in the performance of work under NASA Contract NAS1-18599 and by employees of the United States Government. In accordance with 35 USC 202, the contractor elected not to retain title.

BACKGROUND OF THE INVENTION

1. Field of the Invention

The present invention relates to slow positron beam generators and more particularly to beam generators having positron control capable of stopping a positron in materials, including thin films, to be tested.

2. Description of Related Information

Polymers are strong, light-weight, and can be developed to have desirable mechanical, electrical and optical properties. In the aerospace industry, applications for polymers are increasing. Some of the more challenging applications often call for polymers in the form of thin films. For example, polymer thin films make very desirable dielectrics for microelectronics and use in capacitors. Properties of thin films strongly depend on their molecular morphology. Thin films with the same chemical composition and density can have different physical properties depending on their processing history. For many applications, the internal structure of a thin film should be tested before the thin film is used. Therefore, a technique is necessary for providing information about the internal structure of "finished" thin films.

The inventors in the present invention set out to develop a viable technique for testing the internal structure of materials. Especially difficult was the testing of very thin film materials. No positron beam generator was known to accurately test a material at atmospheric pressure. The adaption of conventional positron annihilation spectroscopy (PAS) was tried for studying thin films.

In the prior art, positron annihilation spectroscopy was used for measuring free volume in polymer discs. See, e.g., "Moisture Dependents of Positron Annihilation Spectra in Nylon N-6", Nucl. Inst. and Methods, Vol. 221 427, 1984 by J. J. Singh, T. L. St. Clair, W. H. Holt, and W. Mock, Jr. Also see "Applications of Positron Annihilation Spectroscopy in Materials Research", Proceedings of 33rd International Symposium on Materials—Pathway to the Future, held at Anaheim, Calif., Mar. 7-10, 1988 by J. J. Singh, Edited by G. Carill, E. D. Newell, W. D. Brown and P. Phelam, pp. 470-421, published by SAMPE, Covina, 1988.

FIG. 1 illustrates a multi-degrader source-target assembly built by the inventors as an early attempt to study thin films. Test films 12 are sandwiched between suitable aluminum energy degraders 10 such that positrons of progressively higher energy are forced to stop in the test films. The multi-degrader source-target assembly includes a sodium isotope ($Na^{22}$) source 14. Preferably all of the positrons emitted from sodium isotope source 14 will stop in a single test film 12. However, as illustrated by the arrows pointing from the sodium isotope source 14 to the test films 12, emitted positrons stop in multiple films. Positrons also stop in aluminum energy degraders 10. In order to eliminate effects of positrons annihilating in the aluminum energy degraders 10, lifetime spectrums were taken both with and without the test films 12 in the multi-degrader source-target assembly. The difference between the spectrums with the test film in the target assembly and the spectrums without the test film in the target assembly represented the test film lifetime data. However, only a small fraction of the incident positron beam stopped in the test films and produced annihilation radiation 16 due to the original Fermi energy distribution of the sodium isotope ($NA^{22}$) positrons. Unfortunately, the assembly of FIG. 1 required 24 hours or more to accumulate enough positron annihilation event data for adequate statistics, even with a 25 $\mu c$ (microurie) $Na^{22}$ source.

SUMMARY OF THE INVENTION

It is an object of the present invention to provide a positron beam generator for rapidly testing materials including thin films.

Another object of the present invention is to provide a positron beam generator for testing materials at atmospheric pressure. Prior beam generators required use of high vacuum test chambers.

Another object of the present invention is to provide a beam generator capable of producing positron beams of adequate intensity for good data statistics in reasonable time.

Another object of the present invention is to provide a beam generator for rapidly assaying the internal structure of materials including thin films.

Another object of the present invention is to provide a positron beam generator for accurately assaying materials including thin films for their molecular morphology.

Another object of the present invention is to provide a positron beam generator capable of generating slow positrons having control over the energy of a generated positron beam.

A further object of the present invention is to provide a position beam generator capable of testing materials thinner than heretofore possible by accurately controlling positrons so that they stop in the tested material rather than outside; prior to the present invention, most positrons could not be controlled and went through the tested material without stopping.

In order to achieve the foregoing and other objects, in accordance with the purposes of the present invention as described herein, wherein a slow positron beam generator is provided with a material to be tested sandwiched between a moderator and a conductive source. A voltage source applies a potential between the moderator and the conductive source so as to force positron diffusing back from the moderator to stop in the material to be tested. The conductive source includes a positron-emitting isotope deposited on a conductive material. When positrons stop in the material to be tested, they annihilate (combine) with electrons and give off annihilation radiation which can be measured to study characteristics of the material to be tested. The invention further includes the corresponding method for measuring film characteristics.

These and other features and advantages of the present invention will become more apparent from the following detailed description with reference to the drawings.

DETAILED DESCRIPTION OF THE PREFERRED EMBODIMENT

Figure 2:
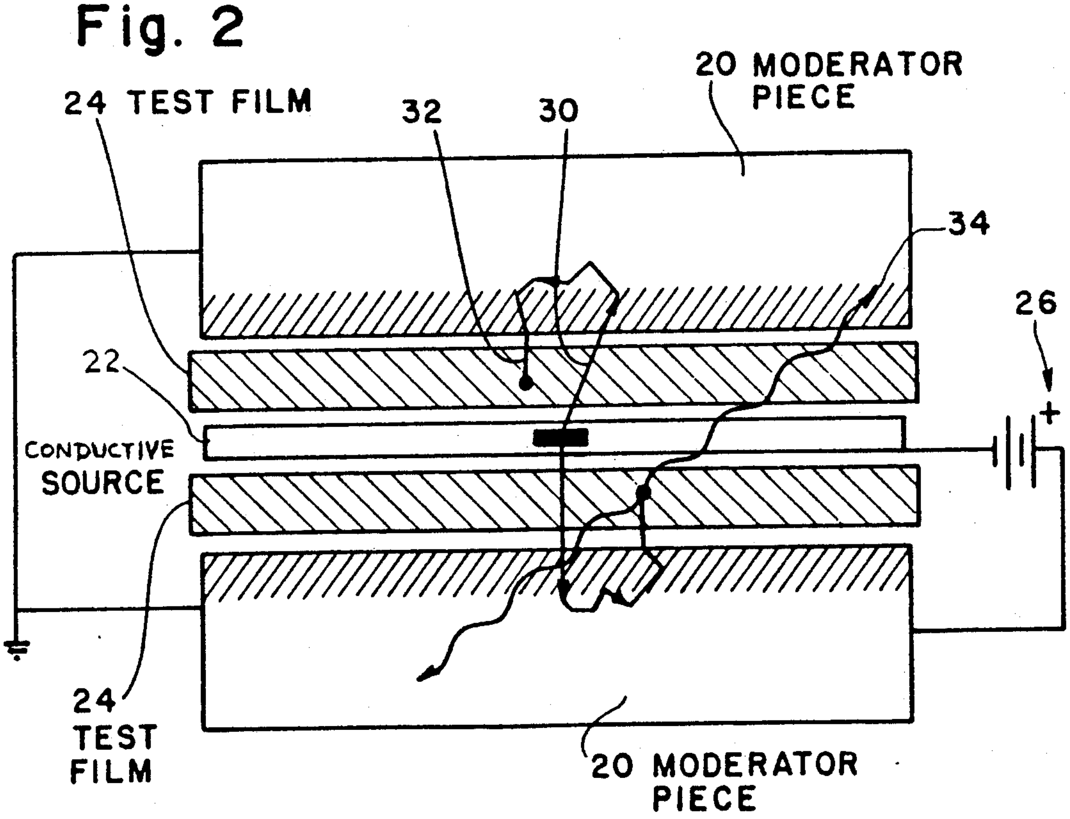
FIG. 2 is a schematic diagram of the positron beam generator in accordance with the principles of the present invention.

FIG. 2 illustrates the positron beam generator of the present invention. A conductive positron source 22 resides between test films 24. Moderator pieces 20 are placed next to test films 24 on the opposite side of conductive source 22. A voltage potential source 26 is applied between the moderator pieces 20 and the conductive source 22. Incident energetic positrons 30 are, first, emitted from conductive source 22, second, passed through test film 24, and then, third isotropically strike moderator pieces 20 before diffusing out of moderator pieces 20 as slow positrons 32. The slow positrons 32 diffusing out of moderator pieces 20 are thermalized positrons. The thermalized positrons are attracted to conductive source 22 which is held at an appropriate potential below moderator pieces 20. The slow positrons 32 have to pass through the test films 24 before reaching conductive source 22. The voltage source 26 is adjusted so that the potential difference between the moderator pieces 20 and the conductive source 22 forces the positions 32 to stop in test films 24. Annihilation radiation 34 (or annihilating photons) are emitted from test film 24 when positrons 32 annihilate (combine) with electrons in test film 24. When positrons annihilate with electrons, the positron anti-particles combine with the electron particles and release their energies in the form of photons or gamma rays.

The present invention provides a slow beam generator for lifetime studies according to the following preferred embodiments. Moderator pieces 20 are preferably materials that have a negative affinity for positrons, that is, a negative work function. A high purity (about 99.95%) polycrystalline tungsten foil strips about 2.54 cm $\times$5.08 cm $\times$0.0127 cm in size were used. A successfully tested moderator other than tungsten is molybdenum. Other moderators, such as platinum, nickel and iridium, may be used instead of tungsten. A moderator having a negative affinity for positrons is something which wants to spit out positrons as does the tungsten moderator in the present invention.

Preferably, the high purity polycrystalline tungsten foil strips are annealed in a vacuum of about $6\times10^{-5}$ pascal by repeatedly heating them to red heat and allowing them to cool down while still in the vacuum. The annealed foil strips are then preferably cut in half forming two 2.54 cm $\times$2.54 cm $\times$0.1027 cm pieces which serve as the two moderator pieces 20 for positron beam moderation.

The beam generator works most efficiently when the tungsten moderators 20 are frequently annealed. The frequency of annealing depends primarily on the time the tungsten moderators 20 are exposed to atmospheric pressure rather than the time which the positron beam generator is in use.

Conductive source 22 preferably contains a positron-emitting isotope. Those known positron-emitting isotope include:$Al^{26}$, $Co^{58}$, $CU^{64}$, $F^{18}$, $Ge^{68}$, $N^{13}$, $Na^{22}$, $Ne^{19}$, $Ni^{57}$, $Cu^{59}$, $O^{15}$, $Ti^{44}$, $V^{48}$, $Zr^{89}$. A conductive source 22 having about a 250 $\mu$c (microurie) sodium isotope source on a metallized mylar was used. The sodium isotope is preferably the $Na^{22}$ isotope.

The conductive positron source 22 includes the positron-emitting isotope deposited on an insulator. The insulator is metallized so it is conductive. A sodium Na $^{22}$ isotope source was deposited on an aluminized mylar of about 2.54 $\mu$m thick. Any insulator other than mylar can be used for carrying the positron source. An insulator having metal on the inside rather than the outside is best. Putting the metal on the inside of the insulator eliminates the problem of the moderator 20 and the source shorting. With the metal on the inside the test films 24 do not need to be insulating. Additionally, if the test film 24 is an insulator, the positron-emmitting isotope can be deposited on a conductor rather than an insulator. Such a conductor could simply be metal foil.

The voltage used for driving the positron beam generator is determined by theoretical calculation dependent upon the materials used in the generator. For most polymer thin films tested, the potential difference between moderator pieces 20 and conductive source 22 was from about 10 volts to 100 volts. The voltage need be accurate to approximately 0.25 volts. While testing the film, the actual voltage used may also be adjusted so that the positrons stop in test film 24.

More specifically, the present invention operates in the following manner. Isotropic positron beams are allowed to penetrate the annealed, high purity tungsten moderator 20. After quick thermalization, the incident positron beams suffer multiple elastic scattering from tungsten atoms, forcing some of the positrons to diffuse out of the same side whence they enter the tungsten moderator 20. Since tungsten has a negative work function for positrons, those positrons that survive annihilation and trapping eventually diffuse out of the tungsten. These positrons can be accelerated to pre-selected energies by applying the potential difference from voltage source 26 between the tungsten moderator 20 and a metal electrode as part of the conductive source 22.

After positrons are injected into tungsten moderator pieces 20, the positrons are quickly thermalized. Subsequently, the positrons suffer multiple elastic scattering over distances of the order of 1,000 Å before annihilating with the electrons. Some of these positrons diffuse back to the entrance surface when they are emitted with an energy spread on the order of 0.2eV. These positrons can be accelerated to a desired energy by applying an appropriate potential difference between tungsten moderator pieces 20 and sodium isotope conductive source 22. It should be noted that the positrons strike the moderator surface isotropically, thereby enhancing their probability of eventual escape from the entrance surface of tungsten moderator 20. Also, the back diffusing positrons come mainly from the near surface regions of tungsten moderator 20 because of a limited acceptance time selected for the positron lifetime measurement system.

As shown in FIG. 2, polymer test films 24 are inserted between conductive source 22 and tungsten moderator pieces 20. Consequently, all re-emitted positrons attracted towards conductive source 22 must pass through test films 24. By adjusting the voltage between conductive source 22 and tungsten moderator pieces 20, all positrons emitted from the tungsten moderator pieces can be made to stop in the polymer test film 24. Thus, thin polymer films which could not be conventionally studied for their free volume characteristics using the multi-degrader assembly of FIG. 1 can be studied readily by applying appropriate voltage on the conductive source 22.

In order to separate the moderator annihilation spectrum from the test film spectrum, it is necessary to make two separate lifetime measurements. The first measurement is made with the conductive source 22 held at $-V$ volts. The second measurement is made with the source held at a much lower potential, such as $-10$ volts. The difference between these two spectrums then gives the effects of annihilation in the interior of the test polymer film. By measuring the total number of counts in the lifetime spectrum with $\pm V$ volts at the conductive source 22, the efficiency ($\epsilon$) of the slow beam generator can be calculated as follows:

$$\epsilon = 2\frac{I(-V) - I(+V)}{I(-V) + I(+V)}$$

The value of $\epsilon$ for the present generator is of the order of 6%.

Figure 1:
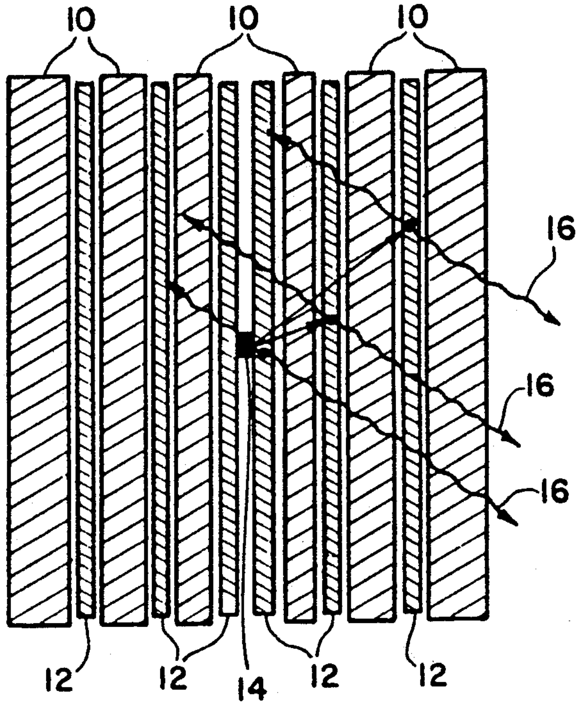
FIG. 1 is a schematic diagram of a multi-degrader source target assembly.

In order to test the validity of the assumption that the thermalized positron beams diffusing back from the moderator surfaces do not suffer inordinate delays with respect to the 1.28 MeV gamma ray time marker, the lifetimes measured in a 0.0089 cm thick teflon film compared using the present system with the corresponding values in a 0.254 cm thick disc obtained by using 9 thick disc procedure like that of FIG. 1. The results are summarized in TABLE I which compares positron lifetimes observed with the present system and the values obtained using a thick disc system.

TABLE I

| Present System 250 μc/0.0089 cm | | | Thick Disc System 25 μc/0.254 cm | | |
|---|---|---|---|---|---|
| $\tau_1/I_1$ | $\tau_2/I_2$ | $\tau_3/I_3$ | $\tau_1/I_1$ | $\tau_2/I_2$ | $\tau_3/I_3$ |
| 241 ps | 725 ps | 3281 ps | 291 ps | 999 ps | 3236 ps |
| 62% | 17% | 21% | 64% | 16% | 20% |

It is apparent that the agreement is reasonably good, particularly in the case of ($\tau_3/I_3$) values which are the basis for free volume measurements in polymers.

The procedure described earlier for the measurement of free volume fraction in two polyimide films has been applied. The physical properties of these films are summarized in Table II.

TABLE II

| No. | 1 | 2 |
|---|---|---|
| Film Composition | PMDA-ODA | ODPA-p-PDA |
| Film Thickness | 0.0043 cm | 0.0051 cm |
| Coefficient of Thermal Expansion (μm/m °C.) | 23.3 | 23.8 |
| Density (gm/cc) | 1.414 ± 0.003 | ≧1.45 |
| Tensile Modulus at 25° C. (psi) | 380,000 | 975,000 |
| Saturation Moist (v/o) | 4.46 | 2.61 |

The polyimide, PMDA/ODA, is a polymer prepared by NASA-Langley which has the same chemical structure as that of Kapton ® (Dupont's commercially available polyimide). The polyimide, ODPA/p-PDA, is an isomer (same chemical formula with different arrangement of chemical units) of Kapton ®. The chemical structure of the two isomers are as follows.

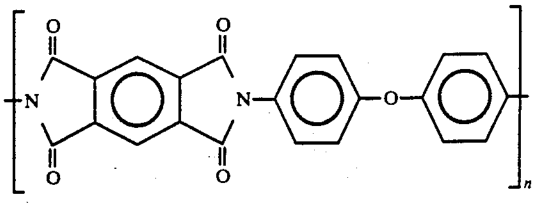

PMDA/ODA

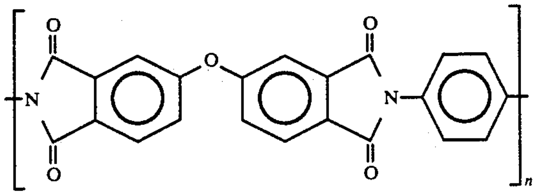

ODPA/p-PDA

The PMDA/ODA is essentially a totally amorphous polymer while the ODPA/p-PDA has a significant level of crystallinity. This crystallinity results in a high modulus in the latter polymer, 975,000 psi, as compared to 380,000 psi for PMDA/ODA. Even though the two systems are isomers of each other, they clearly have considerable differences in their morphologies. The free volume fractions in these films were measured using the relationship between the ortho-positronium lifetime ($\tau$) and the average microvoid size (R):

$$\frac{1}{\tau} = 2\left(1 - \frac{R}{R_o} + \frac{1}{2\pi}\,\mathrm{Sin}\left(2\pi\frac{R}{R_o}\right)\right) \quad (1)$$

where $R_o$=Radius of the spherical potential well(The potential is infinite for $r>R_o$ and constant for $r<R_o$)

$$R=R_o-\Delta R$$

($\Delta R$ is the thickness of the electron layer inside the potential well and has been assumed to be 0.1656 nm)

Equation (1) is based on the assumption that the orthopositronium (O-Ps) lifetime in the electron layer is $\approx$500 picoseconds.

Figure 3:
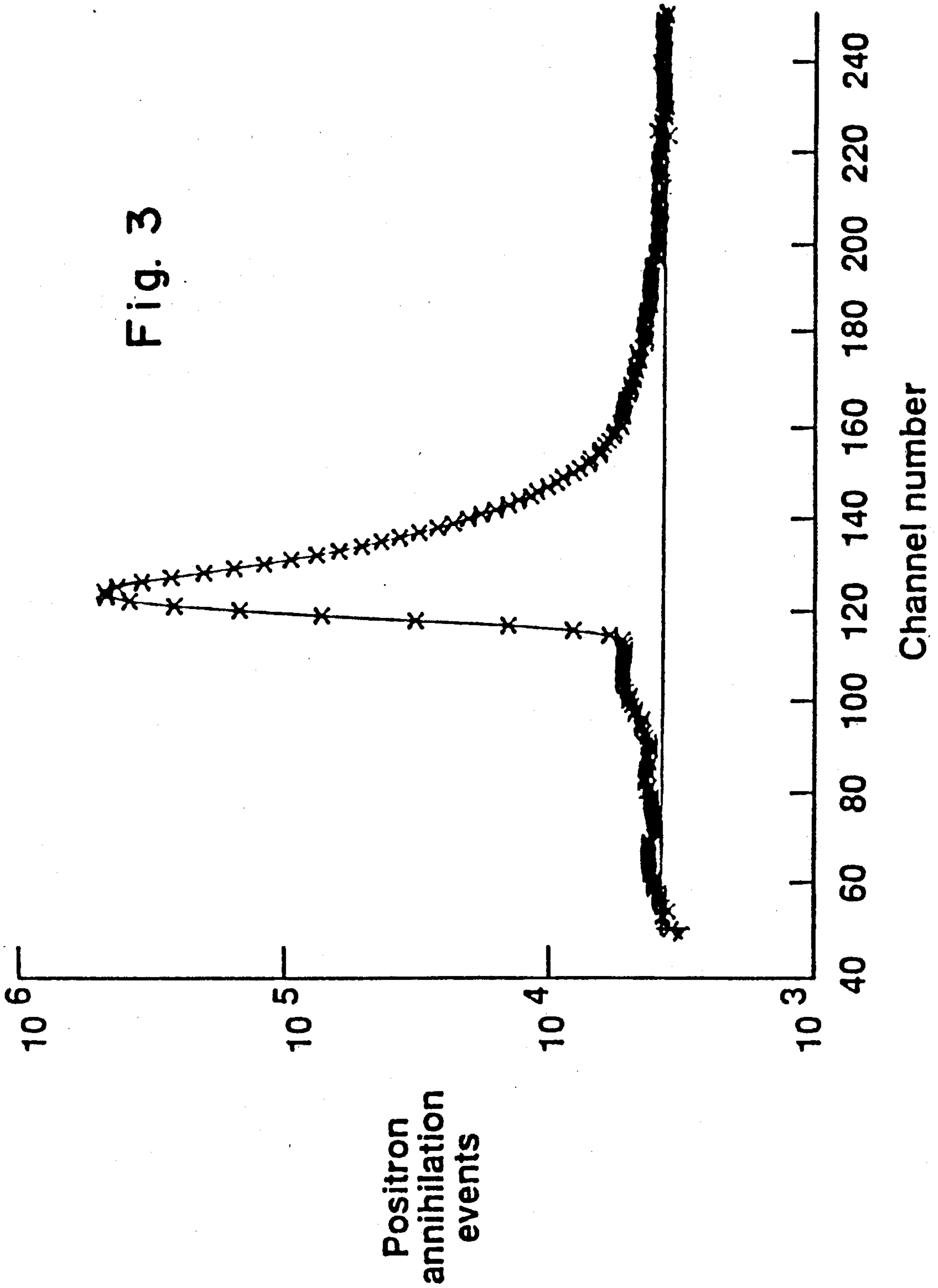
FIGS. 3 and 4 are graphs illustrating a typical lifetime spectrum in a polyimide thin film.
Figure 4:
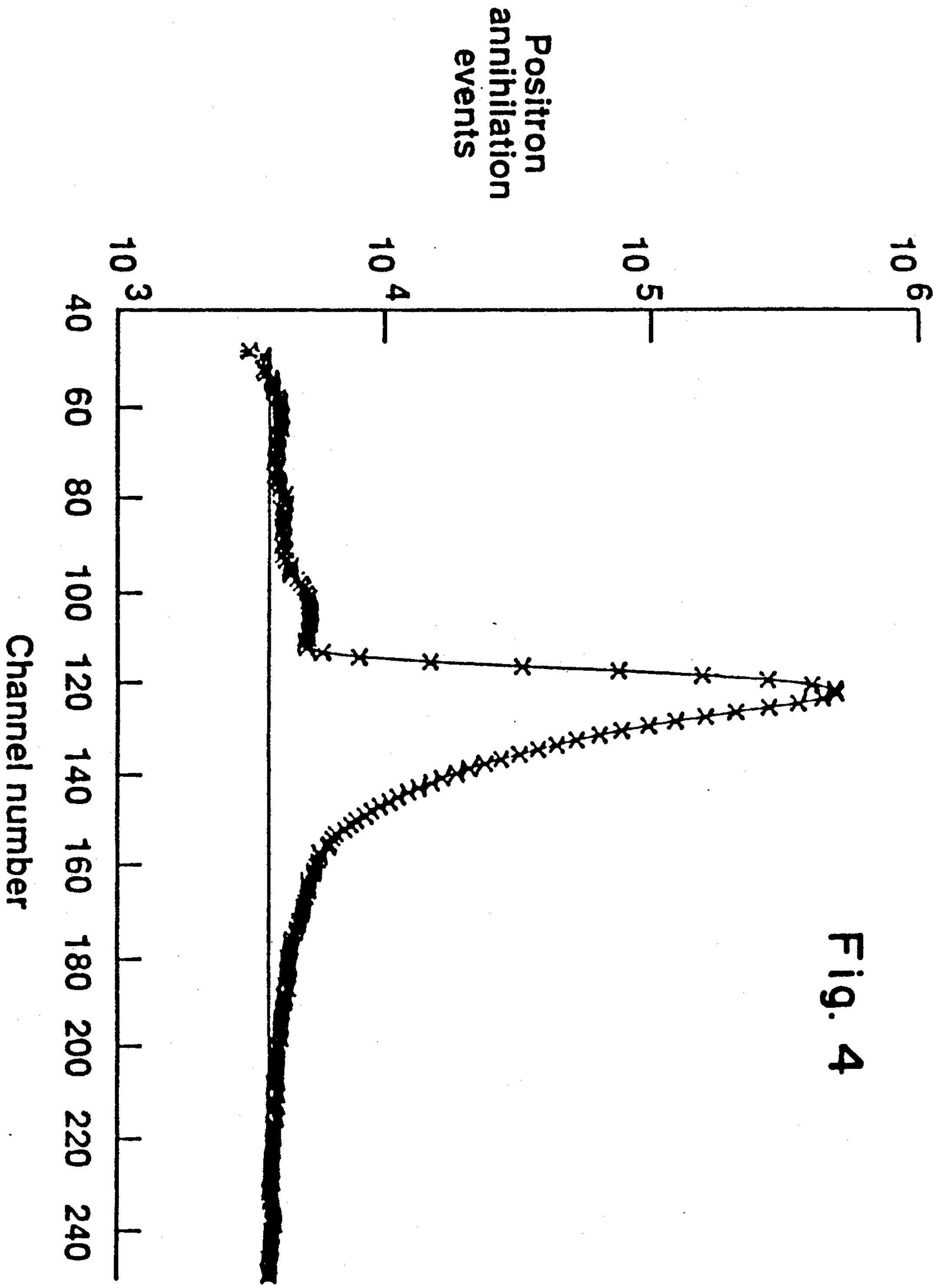
Figure 5:
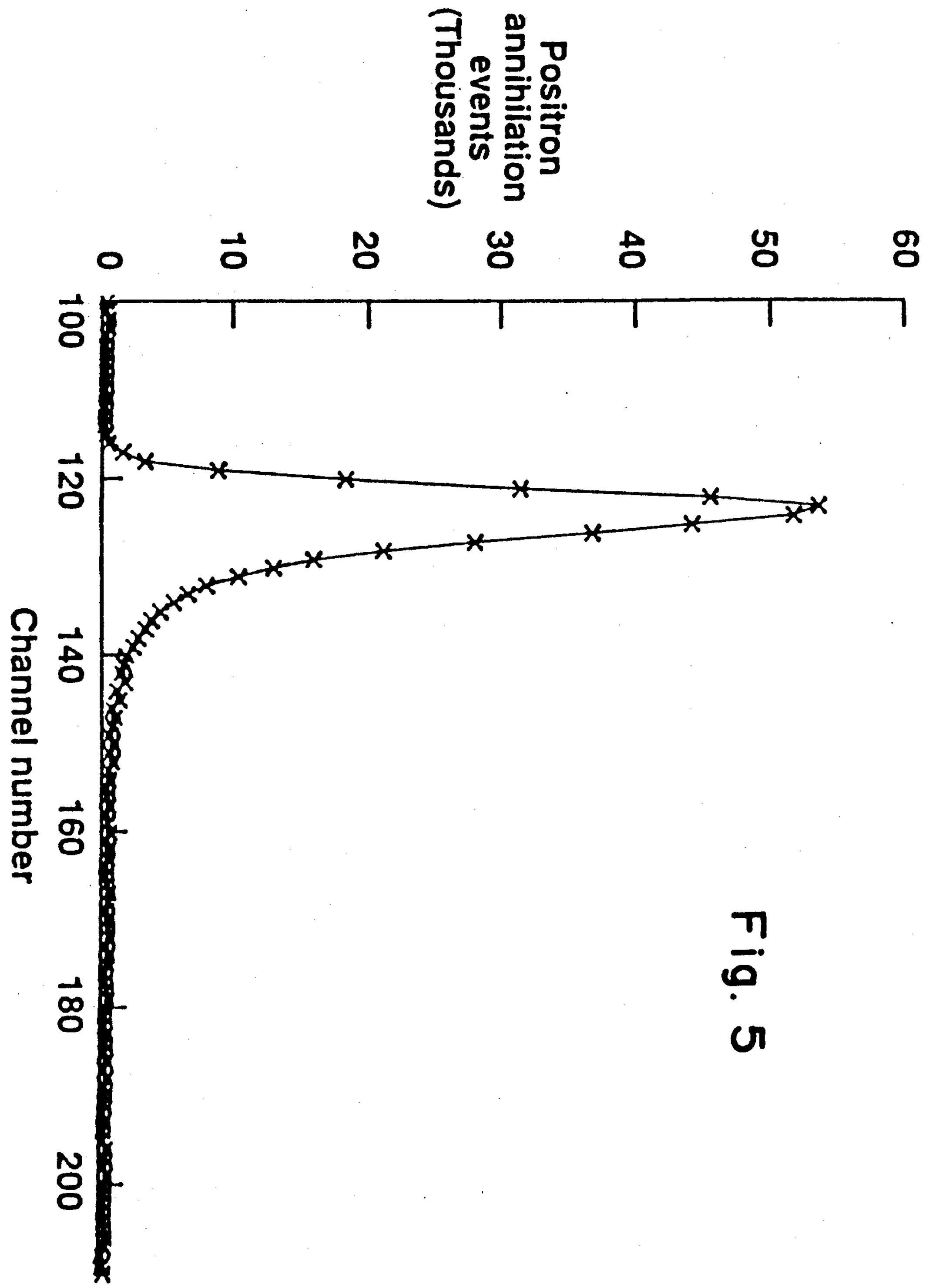
FIG. 5 is a graph illustrating a typical "difference" lifetime spectrum in a polymide thin film.

Positron lifetimes in the polyimide films were measured using a standard fast-fast coincidence lifetime measurement technique applied to the slow positron beam generator. FIGS. 3 and 4 illustrate typical lifetime spectra in polyimide ODPA-p-PDA films. The positron annihilation events are plotted with respect to channel number for a moderator bias of +50 volts and +10 volts, respectively. FIG. 5 illustrates a typical "difference" lifetime spectra in polyimide ODPA-p-PDA films. Positron annihilation events in the thousands are plotted with respect channel number for a difference spectrum of the bias +50-bias+10.

The O-Ps lifetimes and the corresponding values of the average free volume cell volumes, $\langle V_f \rangle$, in the two films are summarized in Table III. As can be seen, ODPA-p-PDA films have large-sized microvoids, but comparatively fewer to them.

TABLE III

| No. | Film Composition | Positron Lifetime Values $\tau_1/I_1$ | $\tau_2/T_2$ | $<V_f>$ $(A)^3$ | N* (Number of Free Volume Cells per Cubic Centimeter) |
|---|---|---|---|---|---|
| 1 | PMDA-ODA | 108 ps/68% | 535 ps/32% | 0.44 | $1.0 \times 10^{23}$ |
| 2 | ODPA-p-PDA | 244 ps/81% | 849 ps/19% | 11.10 | $2.4 \times 10^{21}$ |

$$*N = \frac{\text{Sat. Moisture Volume/cc}}{<V_f>} = \frac{\text{Total Fractional Free Volume/cc}}{\text{Average Volume of a Free Volume cell (cc)}}$$

A slow positron beam generator has been provided suitable for Positron Annihilation Spectroscopic measurements. In polymer thin films about 0.0254 cm thick, an efficiency has been determined by the ratio of the total counts in the difference spectrum and the total counts in the moderator life-time spectrum, on the order of 6%. Furthermore, the present invention also successfully resolves the difficult time problem that can be encountered with positron moderators.

When taking the data measurements, it is not necessary to measure the background each time. A predetermined background can be stored and used over and over without taking a background measurement for each test. The test film can be stressed or heated for measuring different characteristics of different materials. The test film can be materials of many types and thicknesses. For example, the test film can be a liquid crystal.

Numerous modifications and adaptations of the present invention will be apparent to those so skilled in the art and thus, it is intended by the following claims to cover all modifications and adaptations which fall within the true spirit and scope of the invention.

What is claimed is:

1. A slow positron beam generator for material studies comprising:
   - a moderator;
   - a conductive source;
   - a material to be tested juxtaposed between said moderator and said conductive source; and
   - a voltage source connected between said moderator and said conductive source.

2. A slow positron beam generator according to claim 1, wherein said conductive source includes a positron-emitting isotope deposited on a conductive material.

3. A slow positron beam generator according to claim 1, wherein said voltage source provides a potential so as to force positrons to stop in said material to be tested.

4. A slow positron beam generator according to claim 3, wherein said conductive source includes a positron-emitting isotope.

5. A slow positron beam generator according to claim 4, wherein said moderator consists essentially of tungsten.

6. A slow positron beam generator according to claim 3, wherein said conductive source includes a $Na^{22}$ isotope deposited upon a metallized mylar.

7. A positron beam generator for material studies comprising:
   - a plurality of moderator pieces;
   - a conductive source;
   - a plurality of materials to be tested, each film juxtaposed between a moderator piece and a conductive source; and
   - a voltage source connected between said moderator pieces and said conductive sources.

8. A positron beam generator according to claim 7, wherein said voltage source provides a potential so as to force positrons to stop in said material to be tested.

9. A positron beam generator according to claim 8, wherein said potential ranges from about 10 to 100 volts dependent on thickness of said material to be tested.

10. A positron beam generator according to claim 8, wherein said moderator piece consists essentially of tungsten.

11. A positron beam generator according to claim 8, wherein said material to be tested is a thin film.

12. A positron beam generator according to claim 11, wherein said thin film is a polyimide.

13. A positron beam generator according to claim 7, wherein said conductive source includes a positron-emitting isotope.

14. A positron beam generator according to claim 13, wherein said positron-emitting isotope includes $Na^{22}$.

15. A positron beam generator according to claim 13, wherein said moderator piece consists essentially of tungsten.

16. A positron beam generator according to claim 15, wherein said positron source further includes a metallized mylar, said positron-emitting isotope deposited thereon.

17. A positron beam generator according to claim 7, wherein said conductive source includes a positron-emitting isotope deposited upon a conductive material.

18. A positron beam generator according to claim 17, wherein said conductive material is a metallized mylar.

19. A positron beam generator according to claim 18, wherein said mylar is metalized on its inside.

20. A positron beam generation for material studies comprising:
   - a moderator for moderating positrons;
   - a conductive source for emitting positrons of an energy;
   - a material to be tested juxtaposed between said moderator and said conductive source; and
   - means for controlling the energy of the positrons emitted from said conductive source so as to force the positrons to stop in said material to be tested.

21. A method of using a positron beam generator for measuring film characteristics, said method comprising the steps of:
   - (a) placing a film to be tested between a moderator piece and a conductive positron source;
   - (b) adjusting a voltage potential applied between the moderator piece and the conductive positron source so as to force diffusing positrons to stop in the film; and
   - (c) measuring film characteristics by determining a value indicative of positrons stopped in the film.

* * * * *